United States Patent
Wu et al.

(10) Patent No.: US 8,514,988 B2
(45) Date of Patent: Aug. 20, 2013

(54) ENHANCED PILOT SIGNAL RECEIVER (75) Inventors: Qiang Wu, San Diego, CA (US);
Wanlun Zhao, San Diego, CA (US);
Peter John Black, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 1126 days.

(21) Appl. No.: 12/113,903

(22) Filed: May 1, 2008

(65) Prior Publication Data
US 2009/0003495 A1 Jan. 1, 2009

Related U.S. Application Data (60) Provisional application No. 60/939,035, filed on May 18, 2007, provisional application No. 60/978,068, filed on Oct. 5, 2007, provisional application No. 61/014,706, filed on Dec. 18, 2007, provisional application No. 61/038,660, filed on Mar. 21, 2008, provisional application No. 61/016,101, filed on Dec. 21, 2007.

(51) Int. Cl.
*H04B 1/00* (2006.01)

(52) U.S. Cl.
USPC .............. 375/345; 375/147; 375/260

(58) Field of Classification Search
USPC .......... 375/147, 150, 260, 340, 345
See application file for complete search history.

(56) References Cited

U.S. PATENT DOCUMENTS

| | | | |
|---|---|---|---|
| 4,829,593 A * | 5/1989 | Hara ..................... | 455/234.2 |
| 5,900,838 A | 5/1999 | Khan et al. | |
| 5,970,414 A | 10/1999 | Bi et al. | |
| 6,021,330 A | 2/2000 | Vannucci | |
| 6,295,024 B1 | 9/2001 | King et al. | |
| 6,329,948 B1 | 12/2001 | Ishikawa | |
| 6,353,744 B1 | 3/2002 | Wu et al. | |
| 6,493,331 B1 | 12/2002 | Walton et al. | |
| 6,590,881 B1 | 7/2003 | Wallace et al. | |
| 6,831,957 B2 * | 12/2004 | Chen ........................ | 375/345 |
| 6,888,805 B2 | 5/2005 | Bender et al. | |
| 7,016,692 B2 | 3/2006 | Rajkotia | |
| 7,471,241 B1 | 12/2008 | Yang | |
| 7,519,136 B2 | 4/2009 | Qi et al. | |
| 7,528,772 B2 | 5/2009 | Ruutu et al. | |
| 7,565,125 B2 * | 7/2009 | Audinot et al. ........... | 455/234.2 |
| 7,570,962 B2 | 8/2009 | Chou | |
| 7,721,236 B2 | 5/2010 | Hwang et al. | |
| 7,990,317 B2 | 8/2011 | Davis et al. | |
| 8,094,595 B2 | 1/2012 | Montojo et al. | |

(Continued)

FOREIGN PATENT DOCUMENTS

| | | |
|---|---|---|
| CN | 1257387 A | 6/2000 |
| CN | 1419752 A | 5/2003 |

(Continued)

*Primary Examiner* — David B. Lugo
(74) *Attorney, Agent, or Firm* — Thien T. Nguyen (57) ABSTRACT

Briefly, in accordance with one embodiment, a method of adjusting for digital automatic gain control (DAGC) quantization error in a mobile station is as follows. A first DAGC value is stored before reception of one or more enhanced pilot signals. A second DAGC value is computed during reception of the one or more enhanced pilot signal. The first DAGC value is restored after reception of the one or more enhanced pilot signals is over. An advantage associated with this particular embodiment may include reduction in quantization error for digital automatic gain control.

15 Claims, 7 Drawing Sheets

(56) References Cited

U.S. PATENT DOCUMENTS

| | | | |
|---|---|---|---|
| 8,174,446 B2 | 5/2012 | Davis et al. | |
| 2001/0034236 A1 | 10/2001 | Tong et al. | |
| 2002/0183075 A1 | 12/2002 | Fauconnier | |
| 2003/0214908 A1 | 11/2003 | Kumar et al. | |
| 2004/0067759 A1 | 4/2004 | Spirito et al. | |
| 2004/0092233 A1 | 5/2004 | Rudrapatna | |
| 2004/0132443 A1 | 7/2004 | Klein et al. | |
| 2004/0135721 A1 | 7/2004 | Hoven et al. | |
| 2004/0151264 A1* | 8/2004 | Montojo et al. | 375/345 |
| 2004/0203921 A1* | 10/2004 | Bromhead et al. | 455/456.1 |
| 2005/0062530 A1* | 3/2005 | Bardsley et al. | 330/136 |
| 2005/0186948 A1 | 8/2005 | Gallagher et al. | |
| 2005/0232199 A1* | 10/2005 | Liu et al. | 370/331 |
| 2006/0079193 A1* | 4/2006 | Sato et al. | 455/247.1 |
| 2006/0199577 A1* | 9/2006 | Ramakrishna et al. | 455/422.1 |
| 2006/0209670 A1 | 9/2006 | Gorokhov et al. | |
| 2006/0280200 A1 | 12/2006 | Lane et al. | |
| 2007/0135170 A1 | 6/2007 | Khan et al. | |
| 2007/0149217 A1 | 6/2007 | Balachandran | |
| 2007/0189282 A1 | 8/2007 | Lohr et al. | |
| 2007/0229355 A1 | 10/2007 | Han et al. | |
| 2007/0298793 A1 | 12/2007 | Dawson | |
| 2008/0132247 A1 | 6/2008 | Anderson | |
| 2008/0274753 A1 | 11/2008 | Attar et al. | |
| 2009/0124265 A1 | 5/2009 | Black et al. | |
| 2009/0203386 A1 | 8/2009 | Edge et al. | |
| 2009/0280836 A1 | 11/2009 | Chou | |
| 2010/0105405 A1 | 4/2010 | Vujcic | |
| 2011/0111751 A1 | 5/2011 | Markhovsky et al. | |
| 2013/0065610 A1 | 3/2013 | Attar et al. | |

FOREIGN PATENT DOCUMENTS

| | | |
|---|---|---|
| CN | 1926445 A | 3/2007 |
| EP | 0893920 A2 | 1/1999 |
| EP | 0893930 A2 | 1/1999 |
| EP | 1014103 | 6/2000 |
| EP | 1093318 A2 | 4/2001 |
| EP | 1043861 B1 | 6/2002 |
| JP | 5211470 A | 8/1993 |
| JP | 10285640 A | 10/1998 |
| JP | 11122656 A | 4/1999 |
| JP | 2000180186 | 6/2000 |
| JP | 2001051042 A | 2/2001 |
| JP | 2001083229 A | 3/2001 |
| JP | 2001177469 A | 6/2001 |
| JP | 2002516519 A | 6/2002 |
| JP | 2003047044 A | 2/2003 |
| JP | 2003078947 A | 3/2003 |
| JP | 2003520518 A | 7/2003 |
| JP | 2004512788 A | 4/2004 |
| JP | 2004253899 A | 9/2004 |
| JP | 2004535724 A | 11/2004 |
| JP | 2007020162 A | 1/2007 |
| JP | 2009521192 | 5/2009 |
| JP | 4809437 | 8/2011 |
| RU | 2286652 | 10/2006 |
| WO | WO9815149 A1 | 4/1998 |
| WO | WO9950968 A1 | 10/1999 |
| WO | WO0241509 | 5/2002 |
| WO | WO2007004788 A1 | 1/2007 |
| WO | WO2007013850 A2 | 2/2007 |
| WO | WO2007018408 A1 | 2/2007 |
| WO | 2007025138 A2 | 3/2007 |
| WO | WO2007025143 A1 | 3/2007 |
| WO | WO2007120326 A2 | 10/2007 |

\* cited by examiner

| Pilot 400 | MAC | DO Pilot 96 | MAC | Pilot 400 | Pilot 400 | MAC | DO Pilot 96 | MAC | Pilot 400 |

ENHANCED PILOT SIGNAL RECEIVER

RELATED PATENT APPLICATIONS

This patent application claims priority to U.S. Provisional Patent Application Ser. No. 60/939,035, filed on May 18, 2007; U.S. Provisional Patent Application Ser. No. 60/978,068, filed on Oct. 5, 2007; U.S. Provisional Patent Application Ser. No. 61/014,706, filed on Dec. 18, 2007; U.S. Provisional Patent Application Ser. No. 61/038,660, filed on Mar. 21, 2008; U.S. Provisional Patent Application Ser. No. 61/016,101, filed on Dec. 21, 2007; all of the foregoing assigned to the assignee of currently claimed subject matter and herein incorporated by reference in their entirety. Furthermore, this patent application is being concurrently filed with U.S. patent application Ser. No. 12/113,900, titled "Enhanced Pilot Signal", filed on May 1, 2008, by Wu et al.; and U.S. patent application Ser. No. 12/113,810, titled "Position Location for Wireless Communications System", filed on May 1, 2008, by Attar et al.; both of which are assigned to the assignee of currently claimed subject matter and incorporated by reference in their entirety.

FIELD

This disclosure relates to receivers for use in wireless communications or other systems, such as receivers for enhanced pilot signals.

BACKGROUND

Mobile stations or other receivers, such as, for example, cellular telephones, are beginning to include the ability to gather information that provides the ability to estimate position of the mobile station or other receiver. To have this capability, a mobile device, for example, may receive signals from a satellite positioning system (SPS), such as, for example, a Global Positioning System (GPS). Such information, perhaps in conjunction with other received information, may be employed to estimate position location. A variety of scenarios in which a mobile station or receiver may estimate position location are possible.

However, for a variety of reasons, a mobile station may encounter difficulties in receiving signals. For example, difficulties may be experienced if the mobile station is positioned inside of a building, or in a tunnel, etc. In other circumstances, a mobile station may not include an SPS receiver. Again, a variety of scenarios are possible. However, due at least in part to difficulties related to the ability of a mobile station to receive signals enabling it to estimate position location, a need exists for alternate ways for a mobile station or other device to estimate position location.

SUMMARY

Briefly, in accordance with one embodiment, a method of adjusting for digital automatic gain control (DAGC) quantization error in a mobile station is as follows. A first DAGC value is stored before reception of one or more enhanced pilot signals. A second DAGC value is computed during reception of the one or more enhanced pilot signal. The first DAGC value is restored after reception of the one or more enhanced pilot signals is over. An advantage associated with this particular embodiment may include reduction in quantization error for digital automatic gain control.

BRIEF DESCRIPTION OF THE FIGURES

Non-limiting and non-exhaustive embodiments are described herein with reference to the following figures.

DETAILED DESCRIPTION

In the following detailed description, numerous specific details are set forth to provide a thorough understanding of claimed subject matter. However it will be understood by those skilled in the ad that claimed subject matter may be practiced without these specific details. In other instances, methods, apparatuses or systems that would be known by one of ordinary skill have not been described in detail so as not to obscure claimed subject matter.

Reference throughout this specification to one implementation an implementation, one embodiment, an embodiment, or the like may mean that a particular feature, structure, or characteristic described in connection with a particular implementation or embodiment may be included in at least one implementation or embodiment of claimed subject matter. Thus, appearances of such phrases in various places throughout this specification are not necessarily intended to refer to the same implementation or to any one particular implementation described. Furthermore, it is to be understood that particular features, structures, or characteristics described may be combined in various ways in one or more implementations. In general, of course, these and other issues may vary with the particular context. Therefore, the particular context of the description or usage of these terms may provide helpful guidance regarding inferences to be drawn for that particular context.

Likewise, the terms, "and", "and/or", and "or" as used herein may include a variety of meanings that will, again, depend at least in part upon the context in which these terms are used. Typically, "and/or", as well as "or" if used to associate a list, such as A, B or C, is intended to mean A, B, or C, here used in the exclusive sense, as well as A, B and C. In addition, the term "one or more" as used herein may be used to describe any feature, structure, or characteristic in the singular or may be used to describe some combination of features, structures or characteristics.

Some portions of the detailed description which follow are presented in terms of algorithms or symbolic representations of operations on data bits or binary digital signals stored within a computing system memory, such as a computer memory. These algorithmic descriptions or representations encompass techniques used by those of ordinary skill in the data processing or similar arts to convey the substance of their work to others skilled in the art. An algorithm is here, and generally, considered to be a self-consistent sequence of operations and/or similar processing leading to a desired result. The operations and/or processing involve physical manipulations of physical quantities. Typically, although not necessarily, these quantities may take the form of electrical or magnetic signals capable of being stored, transferred, combined, compared or otherwise manipulated. It has proven convenient, at times, principally for reasons of common usage, to refer to these signals as bits, data, values, elements, symbols, characters, terms, numbers, numerals or the like. It should be understood, however, that all of these or similar terms are to be associated with the appropriate physical quantities and are intended to merely be convenient labels. Unless specifically stated otherwise, as apparent from the following discussion, it is appreciated that throughout this specification, discussions utilizing terms such as "processing", "computing", "calculating", "determining" or the like refer to the actions or processes of a computing platform, such as a computer or a similar electronic computing device, that manipulates or transforms data represented as physical electronic or magnetic quantities, or other physical quantities, within the computing platform's memories registers, or other information storage, transmission, or display devices.

As previously indicated, a need exists for ways of estimating position location for a mobile station or other device. Although receiving satellite signals, as previously indicated, provides one approach, other approaches that may either supplement such signals or be employed instead of such an approach remain desirable.

In this context, the term mobile station is meant to refer to any device having the ability to receive wireless signals and send wireless signals, which is also capable of being mobile with rescuer to position location. A mobile station typically will receive signals in connection with usage as part of a wireless communications system. Furthermore, also typically, but not necessarily, a mobile station may communicate with one or more cells in a wireless communication system. Typically, such cells may comprise base stations. Therefore, it may be desirable for information gathered via base station communications to be utilized by a mobile station, sometimes referred to as a mobile, in estimating position location. Likewise, as indicated above, such information may supplement information available through other mechanisms, such as via satellite or via a position determining entity (PDE), for example.

However, a mobile station in communication with one or more base stations to gather information may encounter difficulties in some circumstances due to, for example, interference. For example, interference may occur between signals transmitted by several base stations. Thus, in this examples a mobile station may not be able to adequately communicate with one or more of the base stations, resulting in an inability or a reduced ability to perform an accurate position location estimate. This is sometimes referred to as the "hearability problem" due at least in part to the "near-far effect". For example, for wireless communications systems, such as cdma2000 and WCDMA, to provide without limitation only a few possible examples, downlink pilot signals may be difficult to detect due at least in part to such interference Although claimed subject matter is not limited in scope to any particular embodiment, in a variety of example embodiments, an approach to signal communications may be discussed to address at least in part the issues discussed above. In descriptions of such example embodiments, aspects of the signaling may relate to the time domain, the frequency domain or to other aspects of a particular signal, referred to here as signal dimensions. Nonetheless, it is intended that claims subject matter not be limited in scope to signaling, in these example domains or signal dimensions. These examples are merely illustrative. For example, in other embodiments, instead of time or frequency, other dimensions of a signal may be involved, such as, for example, phase, amplitude, spreading code or spreading code sequence, signal energy or any combinations thereof. In this context, the term signal dimension is intended to refer to a quantifiable aspect of a signal that may vary across a variety of signals and that may be used to categorize or partition signals which vary from one another in this particular quantifiable aspect. A signal, for example, may occupy time and frequency domain resources simultaneously. As described in some of the embodiments below, a scheme may be employed to divide these resources into orthogonal dimensions: in time domain, in frequency domain, in fixed time and frequency domain, or code domain, to provide some examples. Claimed subject matter is not intended to be limited to the specific example embodiments discussed. Rather, many other signaling techniques or signaling approaches that employ other signal dimensions are included within the scope of claimed subject matter. It is intended that the scope of claimed subject matter include all such techniques and approaches.

Figure 1:
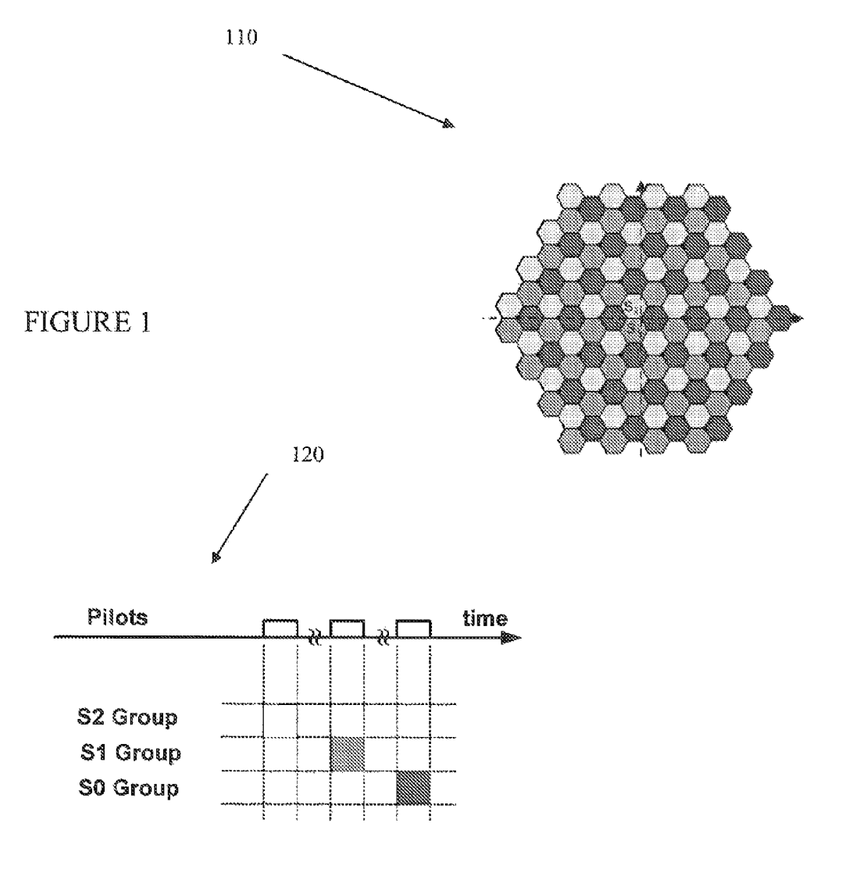
FIG. 1 is a schematic diagram illustrating an embodiment employing three time slots reuse scheme for enhanced pilot signaling.

In one particular embodiment of a method of transmitting signals, for example, signal waveforms may be transmitted from at least two respective sectors of a wireless communications system. The at least two respective sectors, likewise, may be from at least two different sets of a superset of sectors. For example, a superset of sectors, such as illustrated in FIG. 1 as an example, may be divided into at least two, and as illustrated in FIG. 1, in some embodiments, more than two sets of sectors. Thus, in this particular embodiment, the sectors transmitting signals may be from separate sets of sectors. Likewise, in this particular embodiment, the signal waveforms transmitted may be at least nearly mutually orthogonal, at least along a particular signal dimension, such as, for example, time or frequency, as shall be discussed below in more detail.

FIG. 1, for example, illustrates an embodiment in which a superset of sectors are partitioned or divided into 3 sets, S0, S1, and S2, although, of course, claimed subject matter is not limited in scope in this respect. The spatial arrangement of sectors is illustrated by 110 and the particular time slots in which those sectors may transmit enhanced pilot signals is illustrated by 120. As indicated above, this approach could be applied to a variety of signal dimensions, such as, for example time and/or frequency, to provide only two out of more than two possible examples. However, for ease of explanation, we shall illustrate an example embodiment for the protocol 1xEV-DO, which employs uplink and downlink signal transmissions in which information is slotted into various time slots.

Protocol 1xEV-DO is part of a family of CDMA2000 1x digital wireless standards. 1xEV-DO is a third generation or "3G" CDMA standard. There are currently two main versions of 1xEV-DO: "Release 0" and "Revision A". 1xEV-DO is based on a technology initially known as "HDR" (High Data Rate) or "HRPD" (High Rate Packet Data), developed by Qualcomm. The international standard is known as IS-856.

Figure 2:
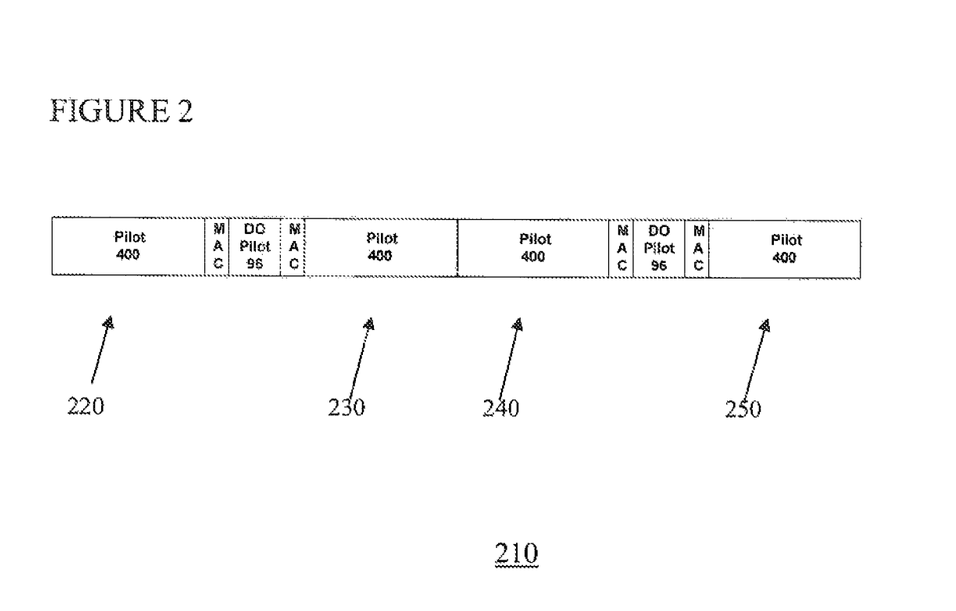
FIG. 2 is a schematic diagram of an embodiment of a slot of a time division multiplexed signal transmission, such as may be employed in 1xEV-DO, for example, to implement enhanced pilot signaling.

FIG. 2 is one possible example embodiment 210 of a time division multiplexed (TDM) signal that may employ enhanced pilot signaling, although, of course, claimed subject matter is not limited in scope to this particular example. Embodiment 210 is intended to illustrate one enhanced pilot signal slot. In the 1xEVDO downlink, a Pilot Channel is time division multiplexed with other channels. The Pilot Channel in this example, is designated by 210-250. A 1xEV-DO downlink transmission includes time slots of length 2048 chips. Groups of 16 slots align with an offset pseudo-random noise or PN sequence. As illustrated by 210, within a slot, Pilot, enhanced media access control (MAC) and Traffic or Control Channels are time division multiplexed. Thus, for an embodiment of enhanced pilot signaling for a 1xEV-DO downlink, time slots may be allocated for enhanced pilot signals. Here, FIG. 2 illustrates one possible embodiment of such a slot structure, although, of course, claimed subject matter is not limited in scope to this example. Many other possible enhanced pilot signal configurations or structures are possible and are included within the scope of claimed subject matter.

For this embodiment, however, enhanced pilot channels or signals are transmitted in the data portion of these dedicated slots, while legacy Pilot and MAC channels are retained for backward comparability. For this embodiment, the enhanced pilot may appear as an unintended packet for legacy mobile stations, for example, that would not have the ability to recognize it. Likewise, for this embodiment, this slot may be transmitted with a relatively low "duty cycle", such as around 1% and still provide signaling benefits. In this way, potential impact on downlink capacity may not be significant.

An aspect of embodiments in accordance with claimed subject matter, such as the embodiment just discussed, relates to so-called "reuse". This term refers to the concept that signaling resources, such as frequency bandwidth or signal duration, for example, that may be available in a particular signaling dimension (or in several signaling dimensions in some embodiments) may be employed (or reemployed) by other or different sectors. For example, in the embodiment described above, dedicated time slots may be partitioned to correspond, for example, to the sets of sectors illustrated in FIG. 1. In this example, 3 non-overlapping partitions have been formed, although claimed subject matter is not limited in scope in this respect. Any number of groups, referred to here as K or as reuse factor 1/K may be employed and the sectors are not required to be non-overlapping. However, regardless of the details of this particular embodiment, a one-to-one association, by construction, may exist between the partitions of the dedicated time slots and the partitions of the sets of sectors of the superset. Sectors of a particular set may only transmit enhanced pilot signals in its associated slots. This is referred to as reuse over time, here, since in this embodiment signaling resources available along the time signaling dimension have been partitioned to correspond to the partitioned sets of sectors that together comprise the superset of sectors.

One advantage of the approach of this particular embodiment, as suggested previously, relates to a reduction in signal transmission interference. In other words, by partitioning sectors along a signal dimension so that the transmitted signal waveforms are nearly mutually orthogonal results in pilot signals that are more easily detected by a mobile station, for example.

Partitioning of sectors or cells for ease of discussion may be referred to here as "coloring", although the use "colors" is, of course, not a necessary feature of claimed subject matter or even of this particular embodiment. Rather, the term "color" is intended here to identify partitions or partitioning. Thus, as described in more detail immediately below, "color" here, which merely designates a partition, which for a sector, for example, refers to a 2tuple, rather than the conventional notion of color. For example, and without limitation, if we let a cell take on a value from the set {Red, Green, Blue} (abbreviated as {R, G, B}), a sector may, in this example, take on a value from the set {R, G, B}x{α, β, γ}, where "x" stands for Cartesian product. Thus, in this example, the "color" of the cell influences the "color" of the sectors of that cell. Of course, it is appreciated that claimed subject matter is not necessarily restricted to partitioning by cells or sectors. For example, in alternative embodiments, other subdivisions or partitions may be employed. However, as indicated above, the color of a sector may be referred to as a 2tuple, for example (R, α) abbreviated as Rα, the first element) again, coming from the color of the cell to which the sector belongs. Based at least in part on the discussion above, it should now be apparent that the reuse factor for this particular example is K=9 or ⅑.

Figure 3:
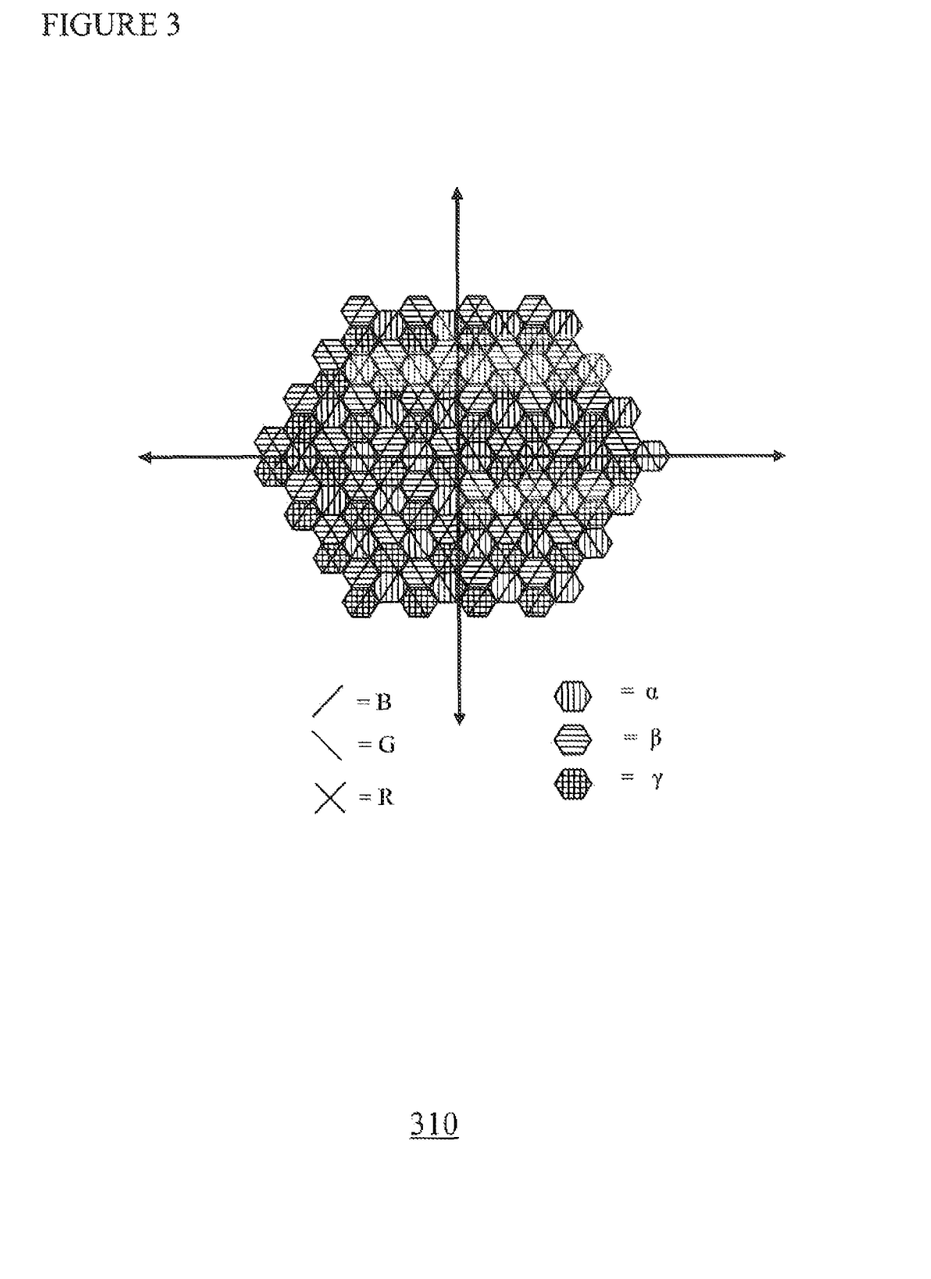
FIG. 3 is a schematic diagram illustrating an embodiment employing nine time slots for enhanced pilot signaling.
Figure 4:
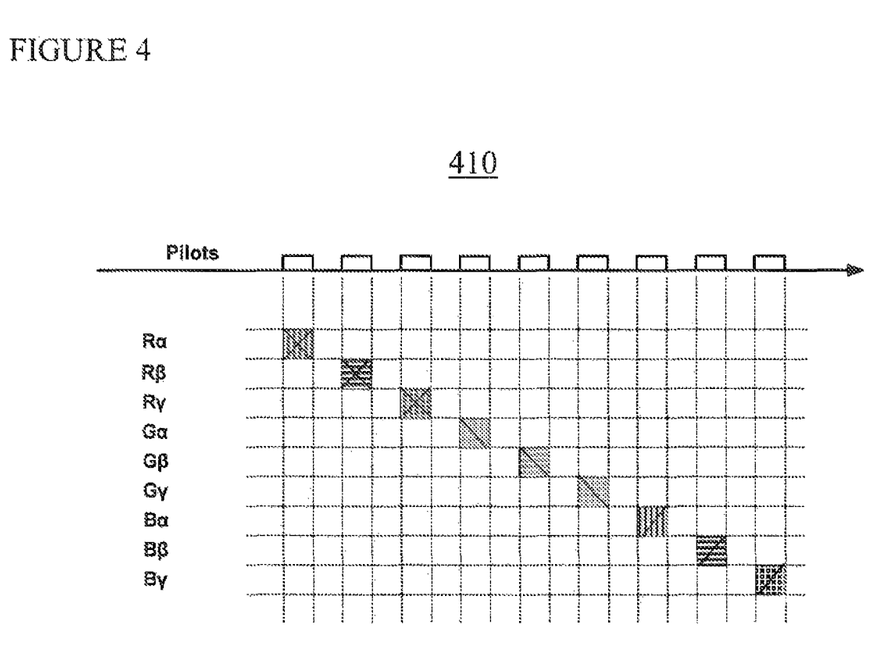
FIG. 4 is a table associated with the embodiment shown in FIG. 3.

An example embodiment 310 is shown in FIG. 3 that differs from the embodiment shown in FIG. 1. FIG. 3 also illustrates an example of planned or dedicated coloring. For the particular embodiment being discussed, transmitted signal waveforms comprise time division multiplexed (TDM) signal waveforms, as illustrated by 410 in FIG. 4. In planned coloring, colors are assigned in a fixed or dedicated manner so as to reduce interference among sectors of the same color in a balanced way, although, of course, claimed subject matter is not limited in scope to employing such an approach. Thus, as is illustrated by FIGS. 3 and 4, signals are transmitted in particular time slots so that potential signal interference is reduced. As may now be appreciated from the above discussion, dedicated resource and reuse reduces inter-channel interference, and thus assists to mitigate the near-far effect and likewise improve hearability. Therefore, for this particular embodiment at least, the TDM signal waveforms that are transmitted in dedicated time slots associated with particular cell sectors comprise highly detectable pilot (HDP) signals. As shall be discussed further below, this allows for improved terrestrial position location estimation accuracy, although, again, claimed subject matter is not limited in scope in this respect.

While dedicated or planned coloring provides potential advantages some of which are discussed above, color assignment to reduce the interference among sectors of the same color in a balance a way would involve some amount of effort. If it were possible to reduce or avoid this effort, it may, in some situations, provide advantageous. One approach may be to employ what may be referred to here as time varying coloring, rather than dedicated coloring. In time varying coloring, the color of various sectors may change with time. One particular example of time varying coloring described in more detail below is referred to here as random coloring. In random coloring, again, the color of various sectors may change; however, the changes are a pseudo-random. Thus, in random coloring, the color of a sector varies with time in a pseudo-random manner, where here, again, with respect to a sector, the term color refers to a 2tuple, as discussed previously. For example, assume, as previously, that enhanced pilot signals are time-multiplexed into 9 time slots to correspond with 9 sets or groupings of sectors that together form a superset, as previously discussed.

As previously described, enhanced pilot channels or signals may be transmitted and provide the ability for greater accuracy in making position location estimates of the mobile station if such signals are received by a mobile station or other receiver. However, a factor in determining whether improved accuracy will be realized depends in at least in part on the ability of the mobile station or other receiver to detect the signals and likewise, process them in such a manner that provides the desired accuracy. Therefore, aspects of the configuration of the receiver of the mobile station or other device may have relevance in connection with position location estimation by the mobile station.

Although there are many aspects of receivers, here, a few specific areas of a configuration of a receiver portion of a mobile station are considered so that advantages afforded by the use of enhanced pilot signals will be realized in operation. In this context, it is desirable to highlight features that may be included to take advantage of a communications system, for example, in which enhanced pilot signals are available. However, claimed subject matter is not limited in scope to particular embodiments. Therefore, while specific embodiments are discussed to illustrate various potential feature enhancements, claimed subject matter is intended to be conceptually much broader than the specifics associated with the embodiments discussed below.

One aspect of a receiver of a mobile station to consider in connection with improved estimates of position location is sources of receiver quantization error. For example, in an example wireless communications system, such as one that may employ 1xEV-DO, as discussed above, wide variations may be observed in received signal energy, depending at least in part upon whether the DO pilot signal is being received or an enhanced pilot signal is being received. As discussed, enhanced pilot signals employ reuse, which has the potential to reduce signal energy. As simple one example, if K=9 is the reuse factor, then the signal energy for enhanced pilot signals may be about an order of magnitude less than that of the DO pilot. However, to the extent these received signals become quantized, significant variations in level may result in increased quantization error due to a relatively large range of possible signal levels. More specifically, an automatic gain control or AGC loop is frequently employed to convert a received signal into a voltage level. Likewise, for processing purposes, the voltage signal level is converted from an analog signal to a digital signal. However, as previously suggested, wide variations in the received signal may contribute to higher levels of quantization error which may ultimately result in signal quality degradation or signal accuracy degradation.

Another aspect to consider is sources of signal interference. An aspect of employing enhanced pilot signals is to reduce interference from nearby base stations that may be transmitting interfering pilot signals. However, other potential sources of interference likewise exist. Another potential source of signal interference for example, may result from adjacent channels other than pilot signals. For example, for 1xEV-DO, bandwidth for a pilot channel is 1.25 MHz. This bandwidth is sufficiently narrow that nearby carrier signals transmitting at the same time may have signal energy at frequencies that overlap with the pilot signal, potentially resulting in interference. Such interference, therefore, may affect hearability and, in this respect, is similar to the near-far effect, discussed previously with respect to enhanced pilot signals.

Yet another aspect of a receiver of a mobile station to consider relates to having adequate time to perform signal processing. Computing a location, position estimate is a relatively complex computation in terms of the operations to be performed. With respect to employing enhanced pilot signals, a large number of signal thresholds are computed due at least in part to the number of transmitting sectors, it is possible that there may not be sufficient time available to perform such calculations or operations for every sector transmitting enhanced pilot signals. If this is the case, it may be desirable to have a mechanism to limit the number of enhanced pilots for which signal detection is performed so that the number of calculations and, as a result, the amount of time to perform signal processing, is reduced.

As previously discussed, wide variations in received signal energy has the potential to affect performance of an AGC loop, particularly if ND conversion is also employed. Thus, as previously indicated errors arising from quantization of an analog signal may have the potential to affect the quality of a position location estimate. One possible approach to addressing an issue such as this may involve a change or upgrade in the base computing device or platform employed. For example, an increase in the number of bits used to quantize the signal should reduce quantization error. However, for a variety of reasons, it may be viewed as desirable to employ a similar platform to the one employed in connection with processing pilot signals that have not been enhanced, such as, for example, the DO pilot signal provided in compliance with the 1xEV-DO specification, as simply one examples. Advantages of this approach may include reduced cost or reduced complexity. Increasing the number of bits may increase either or both. Likewise, it should be desirable to not introduce significant additional computational complexity even assuming a similar platform is employed. Again, as suggested previously, increasing the time to perform signal processing may be undesirable in some instances at least.

Assuming, as just indicated that the platform employed to process enhanced pilot signals is similar or substantially the same as the platform, several possible signal processing approaches remain available to address some of the issues discussed above. As shall be discussed in more detail below, one option in accordance with claimed subject matter may include employing a "window" in which enhanced pilots signals may be received and performing AGC operations based at least in part on the enhanced pilot signals received during such a window. Another options while employing a similar platform as employed for non-enhanced pilot signals, may involve the use of separate AGC loops. For example, two AGC loops may be implemented without significant platform modifications. As shall become clear from the discussion below, to do this, it is desirable to be able to execute signal processing operations at appropriate times with respect to received enhanced pilot signals.

Although claimed subject matter is not limited in scope to this particular embodiment, in one embodiment, a method of reducing digital AGC quantization error in a mobile station may include the following. Signal energy from one or more received enhanced pilot signals may be estimated. A portion of an analog to digital (A/D) converted signal level value may be selected as a digital AGC value based at least in part on the foregoing estimate. Likewise, one or more enhanced pilot signal thresholds may be scaled to at least approximately to adjust for signal processing applied to reduce quantization error.

Signal energy may, for example, be estimated by integrating, over a period, of time I and Q components of received enhanced pilot signals. Although claimed subject matter is not limited in scope in this respect, in one particular embodiment, all six bits of an output signal of a six-bit A/D converter may not necessarily be entirely employed in the AGC loop computations. For example, this may reduce computational complexity, although potentially at the risk of less precision; however, as described below, for an embodiment in accordance with claimed subject matter, precision may be accommodated without resorting to use of all six bits. As an example, without limitation, in one possible embodiment, four bits of the AD converter may be selected to be provided for use in performing threshold detection.

In this particular embodiment, for example, an estimate of signal energy for one or more received enhanced pilot signals is performed dynamically. Typically, the most significant bits, such as the four most significant bits, for example, might be provided, such as in the case of a DO pilot, for example. However, for enhanced pilot signaling, the received energy should be relatively low due at least in part to the reuse factor, 1/K. In a situation such as this, if the most significant bits are provided, information may be lost that may be useful, since more information may be contained in the lesser significant bits. For example, if the energy of the enhanced pilot signal is relatively low, such as one the order of 20 dB below regular DO pilot energy. It may be desirable to provide the four least: significant bits. However, as alluded to above, since this might be viewed as equivalent to shifting a binary signal by several places, it may be appropriate to compensate for changes intended to reduce quantizations error, such as shifting a quantized measurement, through other adjustments in the computations. For example, one approach may be to proportionately scale values or thresholds used to determine whether the level of signal detected is statistically significant. Although claimed subject matter is not limited in scope in this respect, signal levels for one or more received enhanced pilot signals may, for example, be around an order of magnitude less than signal levels for one or more non-enhanced pilot signals, such as, for example, the DO pilot signal received in connection with the 1xEV-DO signaling protocol.

As previously suggested, another possible approach may involve implementing two AGC loops, one for enhanced pilot signals and one for non-enhanced pilot signals. This approach has the advantage that it may be implemented without significant platform modifications. To do this effectively, however, it is desirable to be able to execute signal processing operations at appropriate times with respect to received enhanced pilot signals. For example, although claimed subject matter is not limited in scope in this respect, referring to an AGC loop for a mobile station, the energy of the signal wave front may be accumulated over a number of chips, such as 40 to 60, as only one potential example, and thereafter, the loop may update the estimate at regular intervals of chips, if desired. In contrast, for the AGC loop for the enhanced pilot signal, such energy may be captured once per enhanced pilot burst, which for the embodiment previously described, occurs relatively infrequently, such as about 1% of the time. Therefore, smoothly switching between AGC loops and doing so at appropriate times is desirable.

As previously described, another aspect of potential performance improvement relates to interference from an adjacent channel. In general, although other channels other than enhanced pilot signals may be transmitted over a different carrier, leakage may occur in overlapping frequencies among the various channels, potentially affecting performance. More specifically, degradation may be observed through a lower signal to noise ratio, as one example. This phenomenon is similar to the near-far problem, and thus may affect hearability, as previously described. It is noted likewise, that this effect may not affect all implementations of enhanced pilot signaling. For example, for OFDM systems, in which enhanced pilot signaling may be employed, the amount of available bandwidth is greater, so that interference from adjacent channels may have a barely measurable impact on performance. In contrast, however, for time division multiplexed signals, such as in 1xEV-DO, for example, the allotted bandwidth is 1.25 megahertz, making signal degradation from interference is more likely.

Although claimed subject matter is not limited in scope in this respect, in accordance with one particular embodiment, a notch filter may be applied to received enhanced pilot signal transmissions. As previously suggested, the enhanced pilot signal transmissions from different sets of sectors are mutually orthogonal at least along a time signal dimension, since they are TDM signals. In this embodiment, for example, the notch filter may have a notch at a frequency corresponding to the signal transmissions for the adjacent potentially interfering channels. It is noted, of course, that a host of possible implementations are possible and claimed subject matter is not limited in scope to any particular one. For example, an FIR or an IRR filter may be employed.

Likewise, the filtered signals may be employed to perform automatic gain control. It is worth observing that a notch filter may remove interference from adjacent channels, but it likewise may undesirably increase inter-symbol interference for the enhanced pilot signals. One possible approach to address this, although adding complexity, would be to vary the specific application of the notch filter so that signals are not unnecessarily degraded by its application if there is little interference attributable to adjacent channel transmissions. In this particular embodiment, however, because, again, reduced complexity of signal processing is desired, instead, filtering is always applied to enhanced pilot signals before employing automatic gain control. This approach offers simplicity of implementation without significantly affecting performance. For sectors providing weak enhanced pilot signals to the mobile station, interference attributable to adjacent channel transmissions may be greater than potential inter-symbol interference that the filter may induce. However, for sectors providing strong enhanced pilot signals to the mobile station, the effect of inter-symbol interference from application of filtering is sufficiently small so as not to significantly degrade performance.

As previously suggested, another aspect related to the receiver configuration for a mobile station involves having sufficient time to process enhanced pilot signaling that may be received. As suggested previously, there may not be sufficient time to process signals from every sector transmitting enhanced pilot signals. Therefore, an approach is desired to reduce the number of enhanced pilot signals that a mobile station is to process. If the mobile station is able to omit processing those signals that are less likely provide an accurate estimate of position location, this has the potential to reduce processing time to an acceptable period of time.

One particular embodiment in accordance with claimed subject matter that may permit the mobile station to not process signals less likely to provide an accurate position location estimate may involve providing to mobile station with information about the particular enhanced pilot signaling transmission scheme. For example with limitation, in one embodiment, this information may be loading in memory of the mobile station before the mobile station is deployed. In another embodiment, perhaps this information is transmitted to the mobile station. The mobile station may then use this information to detect enhanced pilot signals for those sectors of interest while omitting sectors that are not of interest.

For example, again, but without limitation, suppose a particular communication system employs an embodiment of enhanced pilot signals that includes dedicated "coloring", as previously described. For ease of discussion, assume this system also employs time multiplexed signals, although, as previously indicated, many other approaches may be employed, such as FDM, OFDM, etc. In this particular embodiment, however, enhanced pilot signals may be detected for selected time slots corresponding to sectors of interest to reduce the amount of signal processing and, therefore, the time to complete the signal processing.

Of course, alternatively such a system may employ a non-dedicated scheme, such as a random or time-varying scheme. In such an embodiment, it may be more complex for the mobile station to determine those slots to detect and those to omit. However, it remains possible to reduce the number of enhanced pilot signals to be processed, as desired. For example, in a non-dedicated scheme employing random coloring, a pseudo-random process is employed to make associations between particular sectors and time slots, for this particular embodiment, for example. If the mobile station has the particular pseudo-random process and the initial seed, for example, it may determine the association. Thus, enhanced pilot signals may be detected based on selected time slots corresponding to sectors of interest, as before. Of course, a similar approach may likewise be employed in an embodiment in which the enhanced pilot signals are FDM signals, for example. Again, by applying the same pseudo-random process starting with the same seed, for example, the mobile station is able to determine the selected frequencies corresponding to selected sectors of interest and check those frequencies as part of a signal detection process, thereby reducing processing to perform such computations.

Similar to non-enhanced pilot signals, enhanced pilot signals may be encoded using a pseudo-random (PN) sequence. In one embodiment, for example, so that non-enhanced pilot signals and enhanced pilot signals are not confused, a frequency inverted PN sequence, which comprises a complex conjugate, may be employed. However, this approach to randomizing the enhanced pilot signals may also be employed as a mechanism to identify those signals to which signal detection is to be applied. Different signals from different sectors or base stations will be coded with a different PN sequence. Thus, by locally generating the PN sequence employed to encode the signals of interest, for example, a mobile station may attempt to decode received signals, looking for a match. If there is a match, the decoded signals may be processed by the mobile station and the enhanced pilot signals may be employed to estimate position location for the mobile station. Alternatively, if there is not a match, then the mobile station may continue to correlate the PN sequence with received signals until a match occurs.

As alluded to previously, in some embodiments, a hybrid approach to position location may be employed. For example, while an enhanced pilot signal may be employed as part of a wireless communications system, it may be supplemented with other information available via signals received through other mechanism to determine position location, such as pseudorandom measurements to space vehicles that may be obtained by processing SPS signals. Likewise, determining a position location estimate need not be performed entirely at the mobile unit. It may, for example, include transmitting location information to an outside entity (e.g., a position determination entity).

As previously discussed, enhanced pilot signals may be provided in many forms, such as time segments, frequency bands, or time-frequency bins. In any of these latter examples, partitioning into K groups along one or more signaling dimensions, such as times frequency, or time-frequency, for example, may be applied so that the partitions are orthogonal or nearly so. Likewise, a superset of sectors may also be partition into K sets or groups. As discussed previously with reference to a particular embodiment, a one-to-one association may be established between the orthogonal or nearly orthogonal partitions and the sector partitions. In such an embodiment, for a particular set of sectors, an enhanced pilot signal may be transmitted with the particular window of the particular one or more signaling dimensions that have been partitioned. Likewise, as discussed previously with reference to a particular embodiment, dedicated coloring or time varying coloring, such as random coloring, may be applied. Therefore, as has been previously discussed and illustrated with respect to particular embodiments, enhanced pilot signaling may be applied to OFDM systems, such as WiMax, LTE, UMS, or other 4G approaches being developed, for example, by 3GPP or 3GPP2. Of course, again, these are examples and claimed subject matter is intended to cover more than OFDM systems as well.

Therefore, wireless communication or position location estimation techniques, such as, for example, the embodiments previously described, may be used for a host of various wireless communication networks. Without limitations these may include Code Division Multiple Access (CDMA) networks, Time Division Multiple Access (TDMA) networks, Frequency Division Multiple Access (FDMA) networks, Orthogonal FDMA (OFDMA) networks, Single-Carrier FDMA (SC-FD MA) networks, etc. A CDMA network may implement one or more radio access technologies (RATs) such as cdma2000, Wideband-COMA (W-CDMA), or Universal Terrestrial Radio Access (UTRA), to name just a few radio technologies. Here, cdma2000 may include technologies implemented according to IS-95, IS-2000, or IS-856 standards. UTRA may include Wideband-CDMA (W-CDMA) or Low Chip Rate (LCR). A TDMA network may implement a radio technology such as Global System for Mobile Communications (GSM). An OFDMA network may implement a radio technology such as Evolved UTRA (E-UTRA), IEEE 802.11, IEEE 802.16, IEEE 802.20, Flash-OFDM® etc. UTRA, E-UTRA, and GSM are part of Universal Mobile Telecommunication System (UMTS). Long Term Evolution (LTE) is an upcoming release of UMTS that may use E-UTRA. UTRA, E-UTRA, GSM, UMTS and LTE are described in documents that may be obtained from the 3rd Generation Partnership Project (3GPP). Cdma2000 is described in documents that may be obtained from the 3rd Generation Partnership Project 2 (3GPP2). 3GPP and 3GPP2 documents are, of course, publicly available.

Figure 6:
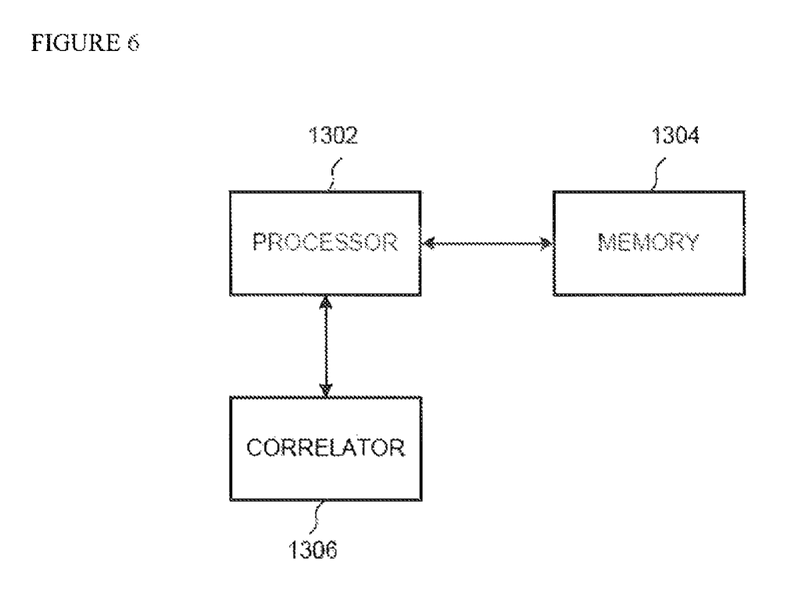
FIG. 6 is a schematic diagram illustrating an embodiment of a system for processing signals.

An example implementation of a system for processing signals is illustrated in FIG. 6. However, this is merely an example of a system that is capable of acquiring signals by processing according to a particular example and other systems may be used without deviating from claimed subject matter. As illustrated in FIG. 6, according to this particular example, such a system may comprise a computing platform including a processor 1302 memory 1304 and correlator 1306. Correlator 1306 may produce correlation functions or operations for signals provided by a receiver (not shown) to be processed by processor 1302, either directly or through memory 1304. Correlator 1306 may be implemented in hardware, firmware, software, or any combination. However, this merely an example of how a correlator may be implemented and claimed subject matter is not limited to this particular example.

Here, however, continuing with this example, memory 1304 may store instructions which are accessible and executable by processor 1302. Here, processor 1302 in combination with such instructions may perform a variety of the operations previously described, such as, for example, without limitation, correlating a PN or other sequence.

Figure 5:
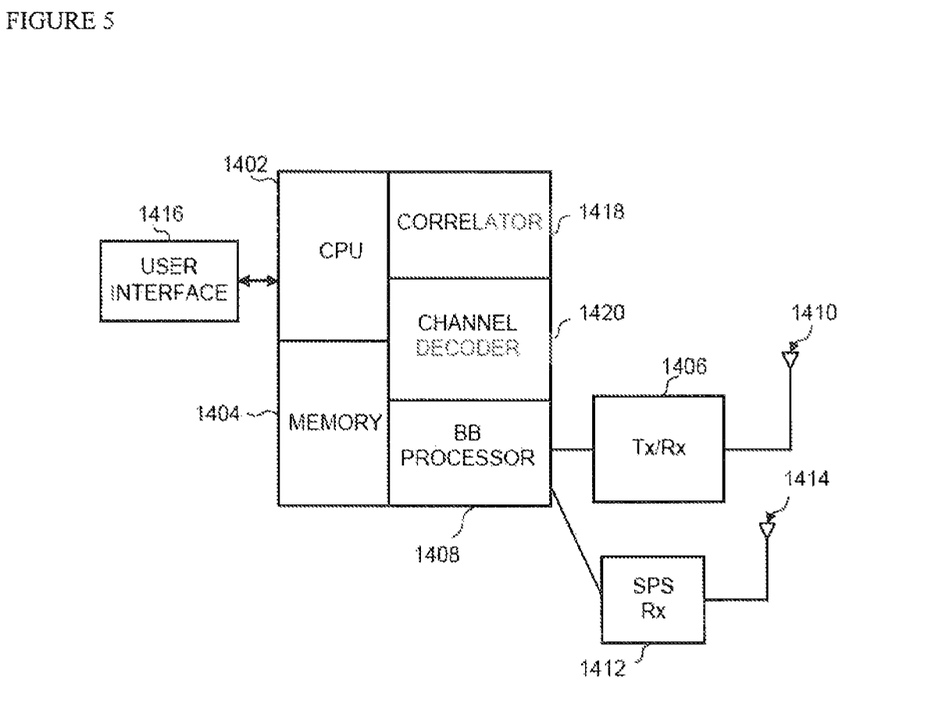
FIG. 5 is a schematic diagram illustrating an embodiment of a mobile station.

Turning to FIG. 5, radio transceiver 1406 may modulate a radio frequency (RF) carrier signal with baseband information, such as voice or data, or demodulate a modulated RF carrier signal to obtain baseband information, Antenna 1410 may transmit a modulated RF carrier or receive a modulated RF carrier, such as via a wireless communications link.

Baseband processor 1408 may provide baseband information from CPU 1402 to transceiver 1406 for transmission over a wireless communications link. Here, CPU 1402 may obtain such baseband information from an input device within user interface 1416. Baseband processor 1408 may also provide baseband information from transceiver 1406 to CPU 1402 for transmission through an output device within user interface 1416. User interface 1416 may comprise a plurality of devices for inputting or outputting user information, such as voice or data. Such devices may include, for example, a keyboard, a display screen, a microphone, or a speaker.

Here, SPS receiver 1412 may receive and demodulate SPS transmissions, and provide demodulated information to correlator 1418. Correlator 1418 may apply correlation functions from information provided by receiver 1412. For a given PN sequence, for example, correlator 1418 may produce a correlation function which may, for example, be applied in accordance with defined coherent and non-coherent integration parameters. Correlator 1418 nay also apply pilot-related correlation functions from information relating to pilot signals provided by transceiver 1406. Channel decoder 1420 may decode channel symbols received from baseband processor 1408 into underlying source bits. In one example in which channel symbols comprise convolutionally encoded symbols, such a channel decoder may comprise a Viterbi decoder. In a second example, in which channel symbols comprise serial or parallel concentrations of convolutional codes, channel decoder 1420 may comprise a turbo decoder.

Memory 1404 may comprise computer readable media to store instructions which are executable to perform one or more of processes or implementations, which have been described or suggested previously, for example. CPU 1402 may access and execute such instructions. Through execution of these instructions, CPU 1402 may direct correlator 1418 to perform a variety of signal processing related tasks. However, these are merely examples of tasks that may be performed by a CPU in a particular aspect and claimed subject matter in not limited in these respects. It should be further understood that these are merely examples of systems for estimating a position location and claimed subject matter is not limited in these respects.

Figure 7:
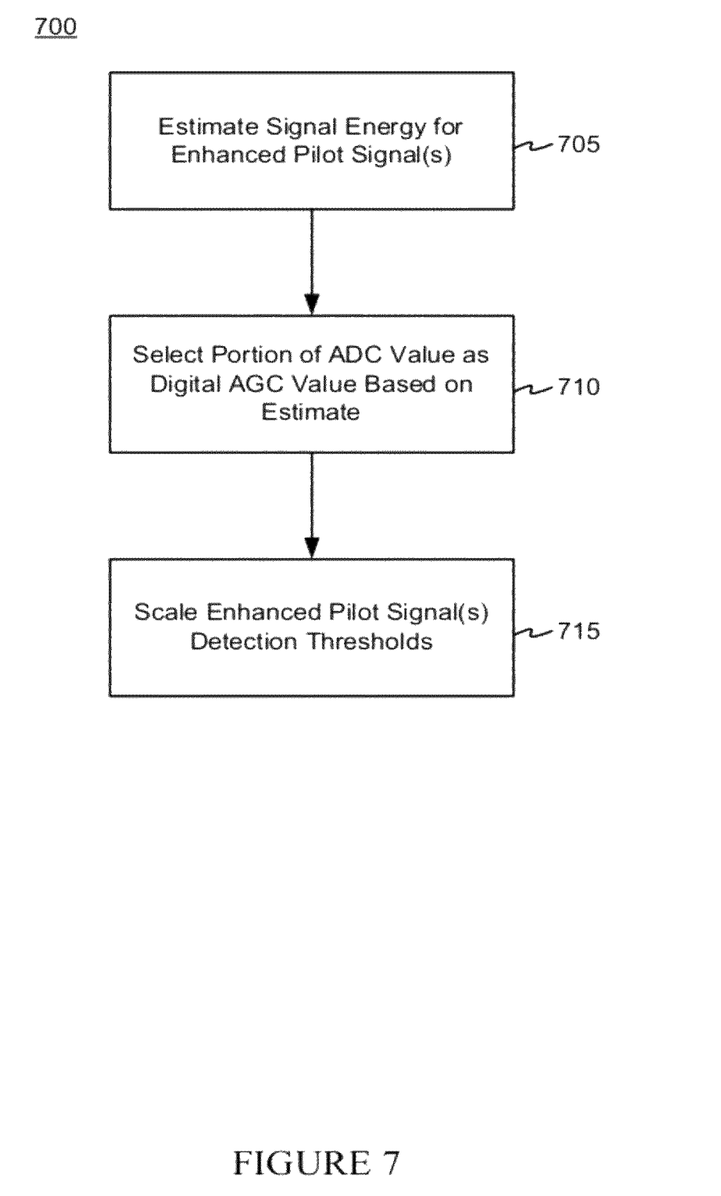
FIG. 7 is a flowchart illustrating an embodiment of a method for processing signals.

FIG. 7 illustrates an example of a method 700 which adjusts for digital automatic gain control (DAGC) quantization error in a mobile station. Method 700 may estimate the signal energy from one or more received enhanced pilot signals (block 705). Once the signal energy is estimated, the method may select a portion of value provided by an analog-to-digital converter (ADC) as a DAGC value, where the selection may be based at least in part on the estimate (block 710). The method may further scale one or more enhanced pilot signal detection thresholds (block 715).

It will, of course, be understood that, although particular embodiments have just been described, claimed subject matter is not limited in scope to a particular embodiment or implementation. For example, one embodiment may be in hardware, such as implemented to operate on a device or combination of devices, for example, whereas another embodiment may be in software. Likewise, an embodiment may be implemented in firmware, or as any combination of hardware, software, and/or firmware, for example. The methodologies described herein may be implemented by various means depending upon the application. For a hardware implementation, the processing units may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, other electronic units designed to perform the functions described herein, or a combination thereof. For a firmware and/or software implementation, the methodologies may be implemented with modules (e.g., procedures, functions, and so on) that perform the functions described herein, Any machine readable medium tangibly embodying instructions may be used in implementing the methodologies described herein.

For example, software codes may be stored in a memory, for example, a memory of a mobile station, and executed by a processor, for example a microprocessor. Memory may be implemented within the processor or external to the processor. As used herein the term "memory" refers to any type of long term, short term, volatile, nonvolatile, or other memory and is not to be limited to any particular type of memory or number of memories, or type of media upon which memory is stored. Likewise, although claimed subject matter is not limited in scope in this respects one embodiment may comprise one or more articles, such as a storage medium or storage media. This storage media, such as, one or more OD-ROMs and/or disks, for example, may have stored thereon instructions, that if executed by a system, such as a computer system, computing platform, or other system, for example, may result in an embodiment of a method in accordance with claimed subject matter being executed, such as one of the embodiments previously described, for example. As one potential example, a computing platform may include one or more processing units or processors, one or more input/output devices, such as a display, a keyboard and/or a mouse, and/or one or more memories, such as static random access memory, dynamic random access memory, flash memory, and/or a hard drive.

In the preceding description, various aspects of claimed subject matter have been described. For purposes of explanation, specific numbers, systems and/or configurations were set forth to provide a thorough understanding of claimed subject matter. However, it should be apparent to one skilled in the art having the benefit of this disclosure that claimed subject matter may be practiced without the specific details. In other instances, well known features were omitted and/or simplified so as not to obscure claimed subject matter. While certain features have been illustrated and/or described herein, many modifications, substitutions, changes and/or equivalents will now occur to those skilled in the art. It is, therefore, to be understood that the appended claims are intended to cover all such modifications and/or changes as fall within the true spirit of claimed subject matter.

The invention claimed is:

1. A method of adjusting for digital automatic gain control (DAGC) quantization error in a mobile station comprising:
   estimating signal energy from one or more received enhanced pilot signals, wherein the enhanced pilot signals are transmitted from at least two respective sectors;
   selecting a portion of an analog-to-digital converted (ADC) value as a DAGC value based at least in part on the estimate; and
   scaling one or more enhanced pilot signal detection thresholds,
   wherein the at least two respective sectors are from at least two different sets of a superset of sectors, and further wherein each set includes a plurality of sectors having an enhanced pilot signal associated with a particular signal dimension.

2. The method of claim 1, wherein the ADC value comprises six bits and the DAGC value comprises four bits.

3. The method of claim 1, wherein the estimated signal energy for the one or more received enhanced pilot signals is at least an order of magnitude less than that for one or more received non-enhanced pilot signals.

4. The method of claim 1, wherein scaling comprises adjusting for the size of a window employed during which to detect one or more received signals and/or the portion of the DAGC value selected.

5. The method of claim 4, wherein the window comprises several hundred chips.

6. The method of claim 4, wherein the window is constructed so that a portion of received signal information is omitted from threshold detection.

7. The method of claim 1, wherein, for more than one received enhanced pilot signals, the enhanced pilot signals are mutually orthogonal along at least one of the following signal dimensions: time, frequency, or any combination thereof.

8. The method of claim 1, wherein the enhanced pilot signal detection thresholds are used to determine whether the estimated signal energy is statistically significant.

9. The method of claim 1, wherein signal levels from the one or more received enhanced pilot signals is an order of magnitude less than signal levels for one or more non-enhanced pilot signals.

10. A non-transitory storage medium having stored thereon instructions that if executed direct a mobile station to estimate signal energy from one or more received enhanced pilot signals, wherein the enhanced pilot signals are transmitted from at least two respective sectors, select a portion of an analog-to-digital converted (ADC) value as a Digital Automatic Gain Control (DAGC) value based at least in part on the estimate, and scale one or more enhanced pilot signal detection thresholds, wherein the at least two respective sectors are from at least two different sets of a superset of sectors, and further wherein each set includes a plurality of sectors having an enhanced pilot signal associated with a particular signal dimension.

11. The non-transitory storage medium of claim 10, wherein, for more than one received enhanced pilot signals, the enhanced pilot signals are to be mutually orthogonal along at least one of the following signal dimensions: time, frequency, or any combination thereof.

12. A mobile station comprising: a computing platform which further comprises a processor, a memory, and a correlator; said computing platform being configured to estimate signal energy from one or more received enhanced pilot signals, wherein the enhanced pilot signals are transmitted from at least two respective sectors, select a portion of an analog-to-digital converted (ADC) value as a Digital Automatic Gain Control (DAGC) value based at least in part on the estimate, and to scale one or more enhanced pilot signal detection thresholds, wherein the at least two respective sectors are from at least two different sets of a superset of sectors, and further wherein each set includes a plurality of sectors having an enhanced pilot signal associated with a particular signal dimension.

13. The mobile station of claim 12, wherein, for more than one received enhanced pilot signals, the enhanced pilot signals are to be mutually orthogonal along at least one of the following signal dimensions: time, frequency, or any combination thereof.

14. A mobile station comprising:
   means for estimating signal energy from one or more received enhanced pilot signals, wherein the enhanced pilot signals are transmitted from at least two respective sectors;
   means for selecting a portion of an analog-to-digital converted (ADC) value as a Digital Automatic Gain Control (DAGC) value based at least in part on the estimate; and
   means for scaling one or more enhanced pilot signal detection thresholds, wherein the at least two respective sectors are from at least two different sets of a superset of sectors, and further wherein each set includes a plurality of sectors having an enhanced pilot signal associated with a particular signal dimension.

15. The mobile station of claim 14, wherein, for more than one received enhanced pilot signals, the enhanced pilot signals are mutually orthogonal along at least one of the following signal dimensions: time, frequency, or any combination thereof.

* * * * *